United States Patent
Yen

(10) Patent No.: US 9,018,993 B1
(45) Date of Patent: Apr. 28, 2015

(54) SELF-FEEDBACK RANDOM GENERATOR AND METHOD THEREOF

(71) Applicant: Storart Technology Co., Ltd., Hsinchu (TW)

(72) Inventor: Chih-Nan Yen, Hsinchu (TW)

(73) Assignee: Storart Technology Co., Ltd., Hsinchu (TW)

( * ) Notice: Subject to any disclaimer, the term of this patent is extended or adjusted under 35 U.S.C. 154(b) by 0 days.

(21) Appl. No.: 14/160,894

(22) Filed: Jan. 22, 2014

(30) Foreign Application Priority Data

Oct. 18, 2013 (TW) .............................. 102137691 A

(51) Int. Cl.
*H03K 3/84* (2006.01)
*H03K 3/037* (2006.01)
*H03K 3/356* (2006.01)

(52) U.S. Cl.
CPC .................. *H03K 3/84* (2013.01); *H03K 3/037* (2013.01); *H03K 3/356182* (2013.01)

(58) Field of Classification Search
None
See application file for complete search history.

(56) References Cited

U.S. PATENT DOCUMENTS

| | | | |
|---|---|---|---|
| 7,362,191 B2 * | 4/2008 | Chen et al. | 331/78 |
| 7,684,462 B2 * | 3/2010 | Ye et al. | 375/130 |
| 2006/0049882 A1 * | 3/2006 | Kim | 331/78 |

* cited by examiner

*Primary Examiner* — Cassandra Cox
(74) *Attorney, Agent, or Firm* — Li & Cai Intellectual Property (USA) Office

(57) ABSTRACT

A self-feedback random generator comprises a digital-to-analog converter, a digital oscillator, a frequency-modulating unit and a first D-type flip-flop. The digital-to-analog converter receives a digital random-code signal and the digital random-code signal is converted to corresponding analog random signal. The frequency-modulating unit modulates frequency of first digital oscillating signal so as to increase random of frequency of first digital oscillating signal according to voltage value of the analog random signal, and accordingly outputs a second digital oscillating signal. The first D-type flip-flop receives the second digital oscillating signal and a clock signal, and reads the second digital oscillating signal through utilizing the clock signal so as to outputs the digital random-code signal, wherein frequency of the clock signal is smaller than frequency of the first digital oscillating signal, and random of frequency of the second digital oscillating signal corresponds to random of the digital random-code signal.

10 Claims, 5 Drawing Sheets

SELF-FEEDBACK RANDOM GENERATOR AND METHOD THEREOF

BACKGROUND OF THE INVENTION

1. Field of the Invention

The instant disclosure relates to a random number generator and random number method; in particular, to a self-feedback random generator and the self-feedback random generating method.

2. Description of Related Art

Currently, random number generator is applied to simulate changes in the weather and lottery games, casino games or computer file security protection. Because flourish of a variety online transactions, such as ATM system, internet communication, password for identity authentication. The computer has a demand of unpredictability transmitting safely, sequence of password with randomness will be very important. Living in an information society and globalization era, relationship among people, computer and internet is increasingly tends to close, so it leads to convenience and popularity of the electronic trading applications. In order to enhance the security of each transaction, random number applied to edit record of each transaction is popular. Generally speaking, random code is traditionally generated by digital circuit purely, but random code generated by traditional method is a circle of $2^N$, wherein N is bit number of random code. Accordingly, random code generated by traditional method is mostly to be predicted, so interested parties should be possible to derive profit such that the security of electronic transactions is gone.

Nowadays, principle of generating random sequence is that truly random sequence is generated from thermal noise or variation principle of phase or frequency, or pseudo random sequence is generated form principle of linear feedback shift register or chaos model.

In the prior art, referring to FIG. 1, FIG. 1 shows circuit block schematic diagram of the traditional random generator. The traditional random generator 100 comprises a local oscillator 110, a first noise source 120, a second noise source 130, a mixer 140, a clock signal generator CK' and a D type flip-flop 160. The mixer 140 is electrically connected to the local oscillator 110, the first noise source 120 and the second noise source 130. The D type flip-flop 160 is electrically connected to the mixer 140 and the clock signal generator 150. The traditional random generator 100 is used for increasing random of a high-frequency signal HS' outputted from the local oscillator 110 through the noise signal NS1、NS2 respectively generated from a first noise source 120 and a second noise source 130 and via the mixer 140, and accordingly outputting an artificial noise signal NS3 to the D type flip-flop 160. Afterwards, the traditional random generator 100 reads artificial noise signal NS3 through utilizing a stable frequency signal generated from the clock signal generator 150. However, because the noise signal NS1、NS2 have regularity, the artificial noise signal NS3 exists any regularity unexpected, so as to reduce random of the traditional random generator 100.

SUMMARY OF THE INVENTION

The instant disclosure provides a self-feedback random generator. The self-feedback random generator a digital-to-analog converter, a digital oscillator, a frequency-modulating unit and a first D type flip-flop. The digital-to-analog converter receives a digital random signal and transforms the digital random signal to an analog random signal correspondingly. The digital oscillator is used for generating a first digital oscillating signal with fixed frequency. The frequency-modulating unit is electrically connected to the analog random signal and the digital oscillator, and the frequency-modulating unit modulates frequency of the first digital oscillating signal according to voltage value of the analog random signal for increasing random of frequency of the first digital oscillating signal, and accordingly outputs a second digital oscillating signal to be served as a self-feedback noise signal. Data input terminal of the first D type flip-flop is electrically connected to the frequency-modulating unit for receiving the second digital oscillating signal, and clock input terminal of the first D type flip-flop receives a clock signal, and the first D type flip-flop reads the second digital oscillating signal through utilizing the clock signal and outputs the digital random signal at data output terminal. Frequency of the clock signal is much smaller than frequency of the first digital oscillating signal, and the random of frequency of the second digital oscillating signal is corresponding to random of the digital random signal.

In an embodiment of the instant disclosure, the self-feedback random generator further comprises a clock signal generator. The clock signal generator is electrically connected to clock input terminal of the first D type flip-flop, and the clock signal generator is used for the clock signal.

In an embodiment of the instant disclosure, the digital-to-analog converter comprises a first current source, a P type transistor, an N type transistor, a second current source and a first output capacitor. One terminal of the first current source is connected to system voltage. Source of the P type transistor is connected to another terminal of the first current source, AND gate of the P type transistor receives digital random signal. Drain of the N type transistor is connected to drain of the P type transistor and the frequency-modulating unit, AND gate of the N type transistor is connected to gate of the P type transistor. One terminal of the second current source is connected to a source of the N type transistor. One terminal of the first output capacitor is connected to the drain of the N type transistor, and another terminal of the first output capacitor is connected to the ground voltage, wherein capacitor voltage of the first output capacitor is served as voltage level of the analog random signal. Under a situation that the first switch and second switch are in switched-on state, when voltage level of the digital random signal is low voltage level, the P type transistor and the N type transistor respectively enter into switched-on state and switched-off state such that the first current source outputs a charging current for charging the first output capacitor; when voltage level of the digital random signal is high voltage level, the P type transistor and the N type transistor respectively enter into switched-off state and switched-on state such that the first output capacitor outputs a discharging current to ground terminal of the ground voltage.

In an embodiment of the instant disclosure, the digital-to-analog converter comprises a second D type flip-flop, an AND gate, an anti-AND gate, a first diode, a second diode and a second output capacitor. Clock input terminal of the second D type flip-flop receives the digital random signal, and data input terminal of the second D type flip-flop is connected to anti-phase data output terminal of the second D type flip-flop. First input terminal of the aAND gate receives the digital random signal, and second input terminal of the AND gate is connected to the data output terminal of the second D type flip-flop for receiving a data signal. First input terminal of the anti-AND gate receives the digital random signal, and second input terminal of the anti-AND gate is connected to the data input terminal of the second D type flip-flop. Anode of the first diode is connected to output terminal of the AND gate, and cathode first diode is connected to the frequency-modulating unit. Cathode of the second diode is connected to output terminal of the anti-AND gate, and anode of the second diode is connected to the frequency-modulating unit and cathode of the first diode. One terminal of the second output capacitor is connected to anode of the second diode, and another terminal of the second output capacitor is connected to a ground voltage, wherein capacitor voltage of the second output capacitor is served as voltage level of the analog random signal. Voltage of the analog random signal is adjusted according to voltage level of the digital random signal and the data signal.

In an embodiment of the instant disclosure, when voltage level of the digital random signal and the data signal are high voltage level, voltage level of the analog random signal increases; when voltage level of the digital random signal is high voltage level and voltage level of the data signal is low voltage level, voltage level of the analog random signal decreases, wherein when voltage level of the digital random signal is low voltage level, voltage level of the analog random signal is unchanged.

The instant disclosure provides a self-feedback random generating method, used for a self-feedback random generator. The self-feedback random generator comprises a digital-to-analog converter, a digital oscillator, a frequency-modulating unit and a first D type flip-flop. The frequency-modulating unit is electrically connected to the digital-to-analog converter and the digital oscillator, data input terminal of the first D type flip-flop is electrically connected to the frequency-modulating unit, clock input terminal of the first D type flip-flop receives a clock signal. The self-feedback random generating method comprises steps as follows: receiving a digital random signal and transforming the digital random signal to an analog random signal corresponding, via the digital-to-analog converter; generating a first digital oscillating signal with fixed frequency; receiving the analog random signal and the first digital oscillating signal, via the frequency-modulating unit; modulating frequency of the first digital oscillating signal for increasing random of frequency of the first digital oscillating signal according to voltage value of the analog random signal, and accordingly outputting a second digital oscillating signal for being served as a self-feedback noise signal; reading the second digital oscillating signal through utilizing the clock signal via the first D type flip-flop, and outputting the digital random signal at data output terminal of the first D type flip-flop, wherein frequency of the clock signal is smaller than frequency of the first digital oscillating signal, and random of frequency of the second digital oscillating signal is corresponding to random of the digital random signal.

In summary, the self-feedback random generator and the self-feedback random generating method thereof provided by the instant disclosure make the digital random signal (i.e. random code) outputted from the first D type flip-flop feedback to the digital-to-analog converter so as to generate the analog random signal, and then modulate the first digital oscillating signal via the analog random signal for increasing random of frequency of the first digital oscillating signal and increasing randomness of random number. Accordingly, the self-feedback random generator is able to generate sequence of random code for increasing the convenience and popularity of electronic trading applications.

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

[One Embodiment of the Self-Feedback Random Generator]

Figure 1:
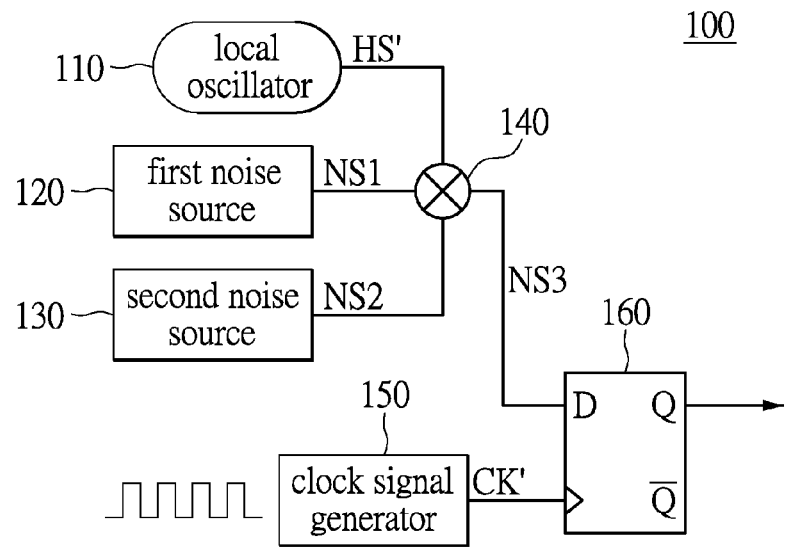
FIG. 1 shows circuit block schematic diagram of the traditional random generator.
Figure 2:
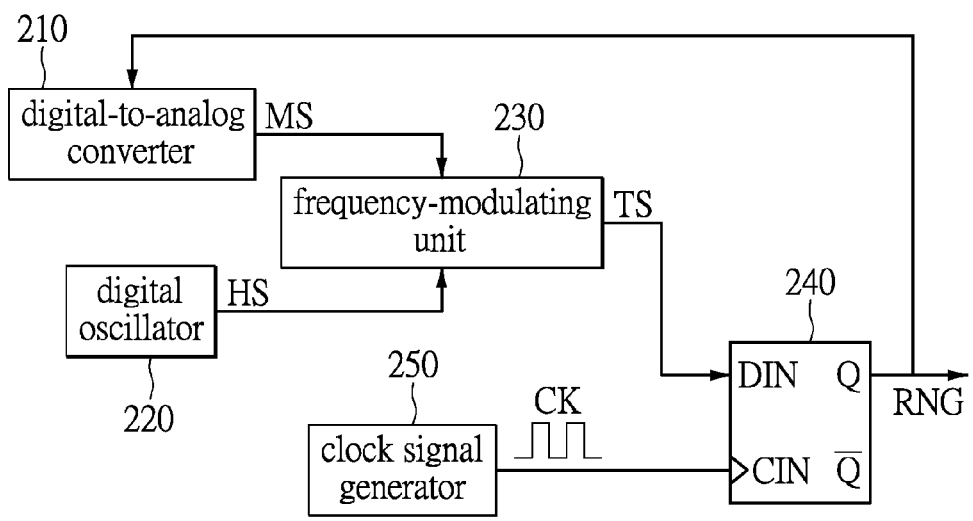
FIG. 2 shows block schematic view of the self-feedback random generator according to one embodiment of the instant disclosure.

Referring to FIG. 2, FIG. 2 shows block schematic view of the self-feedback random generator according to one embodiment of the instant disclosure. As shown in FIG. 2, the self-feedback random generator 200 comprises a digital-to-analog converter 210, a digital oscillator 220, a frequency-modulating unit 230, a first D type flip-flop 240 and a clock signal generator 250. The frequency-modulating unit 230 is electrically connected to the digital-to-analog converter 210 and the digital oscillator 220. Data input terminal DIN of the first D type flip-flop 240 is electrically connected to the frequency-modulating unit 230, clock input terminal CIN of the first D type flip-flop 240 is electrically connected to the clock signal generator 250, and data output terminal Q of the first D type flip-flop 240 is electrically connected to the digital-to-analog converter 210.

Regarding to the digital-to-analog converter 210, the digital-to-analog converter 210 is used for receiving a digital random signal RNG outputted from the first D type flip-flop 240; which is, the self-feedback random generator 200 transmits the digital random signal RNG outputted from the first D type flip-flop 240 to the digital-to-analog converter 210 via self-feedback manner. Moreover, the digital-to-analog converter 210 may transform the digital random signal RNG received an analog random signal MS corresponding, and transmit the analog random signal MS to the frequency-modulating unit 230, wherein different digital values are corresponding to different analog voltage values.

Regarding to the digital oscillator 220, the digital oscillator 220 is used for generating a first digital oscillating signal HS with fixed frequency, and transmits the first digital oscillating signal HS to the frequency-modulating unit 230.

Regarding to the frequency-modulating unit 230, the frequency-modulating unit 230 is used for respectively receiving the analog random signal MS transmitted by the digital-to-analog converter 210 and the first digital oscillating signal HS transmitted by the digital oscillator 220. Furthermore, the frequency-modulating unit 230 modulates frequency of the first digital oscillating signal HS so as to increase random of frequency of the first digital oscillating signal HS according to voltage value of the analog random signal MS, and accordingly outputs a second digital oscillating signal TS. In other words, the first digital oscillating signal HS is an oscillating signal with fixed frequency or regularity, and the second digital oscillating signal TS is an oscillating signal without fixed frequency or regularity. It is worth to mention that random of frequency of the second digital oscillating signal TS is corresponding to random of the digital random signal RNG.

Regarding to the first D type flip-flop 240, data input terminal DIN of the first D type flip-flop 240 is used for receiving the second digital oscillating signal TS so as to make the second digital oscillating signal TS be served as a self-feedback noise signal, and reads the second digital oscillating signal TS through utilizing a clock signal CLK, and then outputs next digital random signal RNG at data output terminal Q of the first D type flip-flop 240, wherein frequency of the clock signal CLK is smaller than frequency of the first digital oscillating signal HS.

Regarding to the clock signal generator 250, the clock signal generator 250 is sued for generating the clock signal CLK with digital form, and the clock signal generator 250 transmits the clock signal CK to clock input terminal CIN of the first D type flip-flop 240.

In the following description is further instruction in teaching a work mechanism of the self-feedback random generator 200.

Figure 3:
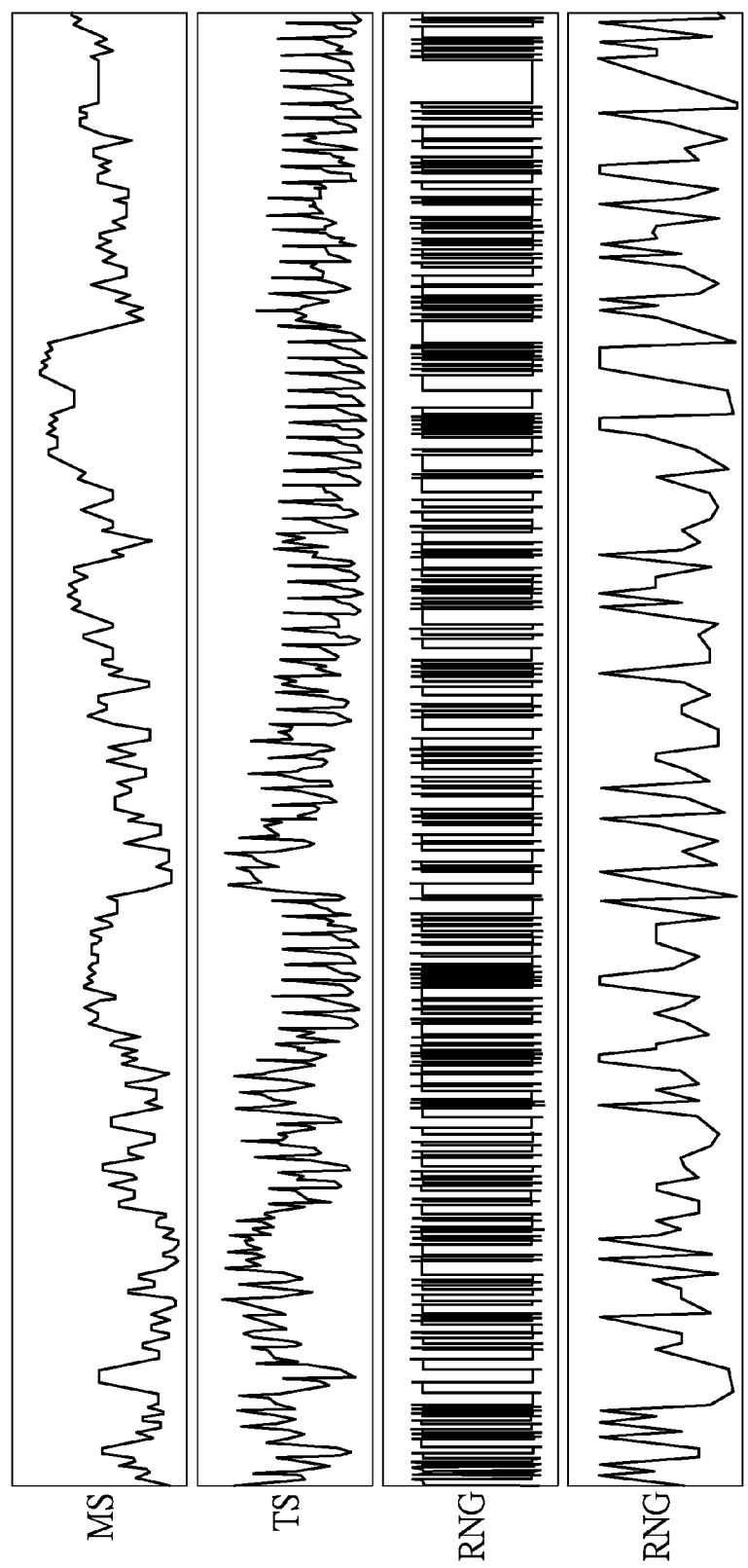
FIG. 3 shows waveform diagram of the self-feedback random generator according to one embodiment of the instant disclosure.

Referring to FIGS. 2 and 3 concurrently, FIG. 3 shows waveform diagram of the self-feedback random generator according to one embodiment of the instant disclosure. In the present embodiment, the self-feedback random generator 200 utilized random number outputted currently to be served as a noise interference source such that next random number outputted does not exist any regularity. Accordingly, the self-feedback random generator 200 may provide a computer security protection and various online trading, such as ATM system, and then field of the internet communication has great development and application efficiently. Furthermore, the self-feedback random generator 200 transmits (i.e. self-feedback manner) the digital random signal RNG outputted from data output terminal Q of the first D type flip-flop 240 to the digital-to-analog converter 210, and then transforms the digital random signal RNG to the analog random signal MS corresponding via the digital-to-analog converter 210. In one embodiment, digital-to-analog converter 210 has solution with four bits, and when the first D type flip-flop 240 transmits the digital random signal RNG, one of digital logic ⌜0000_0000⌟~⌜1111_1111⌟, to the digital-to-analog converter 210, the digital-to-analog converter 210 transforms the digital random signal RNG to a voltage value corresponding (0~1000 millivolts), i.e. voltage waveform of the analog random signal MS as shown in FIG. 3, and thus the analog random signal MS also has a very high random. In the other hand, the digital oscillator 220 may generate the first digital oscillating signal HS with fixed frequency, and transmit the first digital oscillating signal HS to the frequency-modulating unit 230. It is worth to mention that, in the present embodiment, the first digital oscillating signal HS is a high frequency signal and the clock signal CK is a high frequency signal, compared to the clock signal CK generated from the clock signal generator 250. Afterwards, frequency-modulating unit 230 may adjust or modulate frequency of the first digital oscillating signal HS so as to increase random of frequency of the first digital oscillating signal HS according to voltage value of the analog random signal MS and accordingly transmit the second digital oscillating signal TS (as shown in FIG. 3) to data input terminal DIN of the first D type flip-flop 240 for being served as a noise interference source, wherein the second digital oscillating signal TS shown in FIG. 3 is presented with analog signal waveform. In detail, when voltage value of the analog random signal MS read by the frequency-modulating unit 230 is 250 mV at one time-point, the frequency-modulating unit 230 may modulate frequency of the first digital oscillating signal HS and output the second digital oscillating signal TS with a frequency value corresponding to 250 mV. At another time-point, when voltage value of the analog random signal MS read by the frequency-modulating unit 230 is 512 mV, the frequency-modulating unit 230 may modulate frequency of the first digital oscillating signal HS and output the second digital oscillating signal TS with a frequency value corresponding to 512 mV.

It is worth to mention that the digital oscillator 220 and the frequency-modulating unit 230 in the present embodiment may be served as a voltage-controlled digital oscillator; which is, the voltage-controlled digital oscillator may output the second digital oscillating signal TS with a corresponding frequency according to voltage value of the analog random signal MS.

Next, the first D type flip-flop 240 may read or sample the second digital oscillating signal TS through utilizing the clock signal CK with low frequency, so as to output another digital random signal RNG, and concurrently transmit the digital random signal RNG to the digital-to-analog converter 210 so as to perform above-mentioned operation flow. As shown in FIG. 3, voltage waveform diagram and frequency waveform diagram of the digital random signal RNG along time-axis has relatively high random, and for easy understanding the instant disclosure, the voltage waveform diagram and frequency waveform diagram of the digital random signal RNG along time-axis are presented with analog signal form. In short, the self-feedback random generator 200 of the instant disclosure transmits (i.e. self-feedback manner) the digital random signal RNG with high random to the digital-to-analog converter 210, and then modulate frequency of the first digital oscillating signal HS according to voltage value of the analog random signal MS through utilizing frequency-modulating skill, and thus the frequency-modulating unit 230 outputs the second digital oscillating signal TS to the first D type flip-flop so as to generate the digital random signal (another random number). Accordingly, self-feedback random generator 200 of the instant disclosure is able to generate random sequence with high random and no period so as to increase convenience and popularity of the electronic trading application, which is benefit for any kind of purpose in industry for security systems, wafer testing system and communication system.

For a specific instruction on an operation process of the self-feedback random generator 200 of the instant disclosure, there is at least one of the embodiments for further instruction.

In the following embodiments, there are only parts different from embodiments in FIG. 2 described, and the omitted parts are indicated to be identical to the embodiments in FIG. 2. In addition, for an easy instruction, similar reference numbers or symbols refer to elements alike.

[Another Embodiment of the Self-Feedback Random Generator]

Regarding to the digital-to-analog converter 210, the instant disclosure provides two embodiments in the following instruction and further describes each operation mechanism in the self-feedback random generator.

Figure 4:
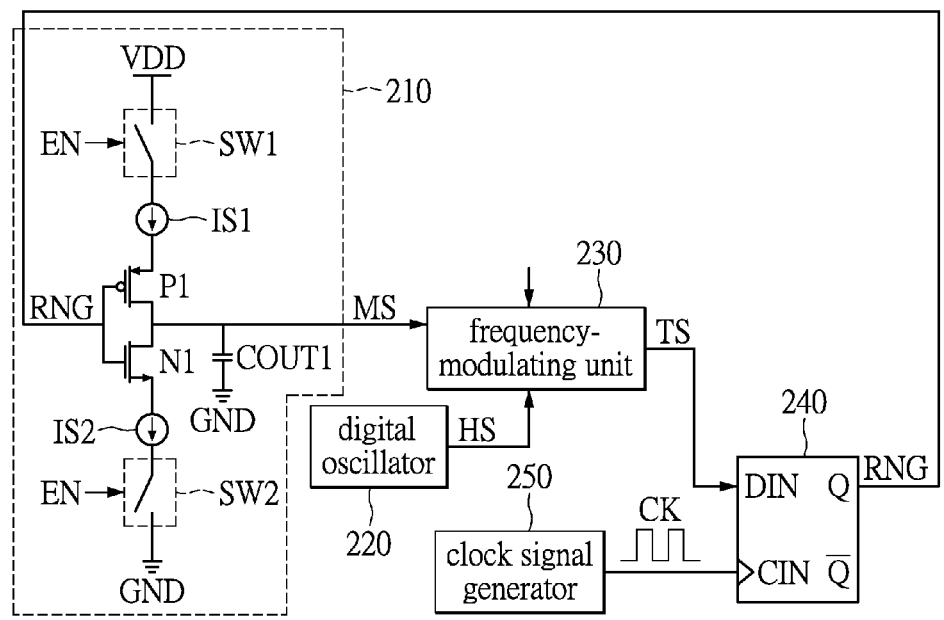
FIG. 4 shows block schematic diagram of the self-feedback random generator according to another embodiment of the instant disclosure.

Referring to FIG. 4, FIG. 4 shows block schematic diagram of the self-feedback random generator according to another embodiment of the instant disclosure. Difference from above-mentioned embodiment in FIG. 2 is that digital-to-analog converter 210 in the self-feedback random generator 400 comprises a first switch SW1, a first current source IS1, a P type transistor P1, a N type transistor N1, a second current source IS2, a second switch SW and a first output capacitor COUT1. First terminal of the first switch SW1 is connected to a system voltage VDD, control terminal of the first switch SW1 receives an enable signal EN for determining switched-on or switched-off state. One terminal of the first current source IS1 is connected to second terminal of the first switch SW1. Source of the P type transistor P1 is connected to another terminal of the first current source IS1, AND gate of the P type transistor P1 receives the digital random signal RNG. Drain of the N type transistor N1 is connected to drain of the P type transistor P1 and the frequency-modulating unit 230, AND gate of the N type transistor N1 is connected to gate of the P type transistor P1. First terminal of the second switch SW2 is connected to another terminal of the second current source IS2, and second terminal of the second switch SW2 is connected to the ground voltage GND, and control terminal of the second switch SW2 receives the enable signal EN for determining switched-on or switched-off state. One terminal of the first output capacitor COUT1 is connected to drain of the N type transistor N1, and another terminal of the first output capacitor COUT1 is connected to the ground voltage GND, wherein capacitor voltage of the first output capacitor COUT1 is served as voltage level of the analog random signal MS.

There is further instruction in teaching an operation mechanism of the self-feedback random generator 400 as recited below.

In the present embodiment, when the first switch SW1 and the second switch SW2 enters into switched-on state according to the enable signal EN received and when voltage level of the digital random signal RNG outputted from the first D type flip-flop 240 is low voltage level (i.e. digital logic 「0」), the P type transistor P1 and the N type transistor N1 may respectively enters into switched-on and switched-off state and the first current source IS1 may output charging current for charging the first output capacitor COUT1 so as to increase the capacitor voltage, wherein voltage value of the capacitor voltage is corresponding to voltage value of the analog random signal MS. When voltage level of the digital random signal RNG outputted from the first D type flip-flop 240 is high voltage level (i.e. digital logic 「1」), the P type transistor P1 and the N type transistor N1 respectively enters into switched-off or switched-on state such that the first output capacitor COUT1 outputs a discharging current to ground terminal of the ground voltage GND for discharging, and thus releases capacitor voltage of the first output capacitor COUT1. The self-feedback random generator 400 transforms the digital random signal RNG to the analog random signal MS corresponding via above-mentioned work mechanism of charging and discharging.

Figure 5:
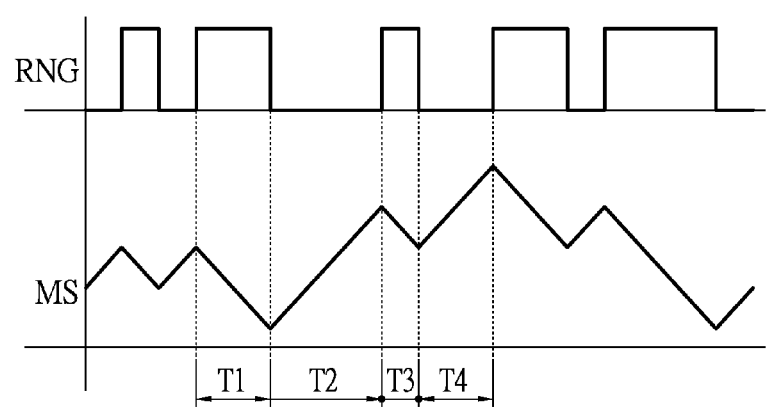
FIG. 5 is driving waveform diagram of the self-feedback random generator corresponding to FIG. 4.

Referring to FIGS. 4 and 5, FIG. 5 is driving waveform diagram of the self-feedback random generator corresponding to FIG. 4. For example, in the time interval T1, when digital-to-analog converter 210 receives digital random signal RNG with digital logic 「11」, the P type transistor P1 and the N type transistor N1 respectively enters into switched-off or switched-on state such that the first output capacitor COUT1 outputs a discharging current to a ground terminal of the ground voltage GND for discharging, wherein voltage value of the analog random signal MS is corresponding to capacitor voltage value of the first output capacitor COUT1, and thus voltage value of the analog random signal MS decreases continuously. In the time interval T2, when digital-to-analog converter 210 receives digital random signal RNG with digital logic 「000」, the P type transistor P1 and the N type transistor N1 respectively enters into switched-off or switched-on state such that the first current source IS1 output the charging current for charging the first output capacitor COUT1 so that voltage value of the analog random signal MS increase continuously. In the time interval T3, when digital-to-analog converter 210 receives digital random signal RNG with digital logic 「1」, voltage value of the analog random signal MS starts to decrease. In the time interval T4, when digital-to-analog converter 210 receives digital random signal RNG with digital logic 「00」, voltage value of the analog random signal MS starts to increase.

For a specific instruction on an operation process of the self-feedback random generator 200 of the instant disclosure, there is at least one of the embodiments for further instruction.

In the following embodiments, there are only parts different from embodiments in FIG. 2 described, and the omitted parts are indicated to be identical to the embodiments in FIG. 2. In addition, for an easy instruction, similar reference numbers or symbols refer to elements alike.

[Another One Embodiment of the Self-Feedback Random Generator]

Figure 6:
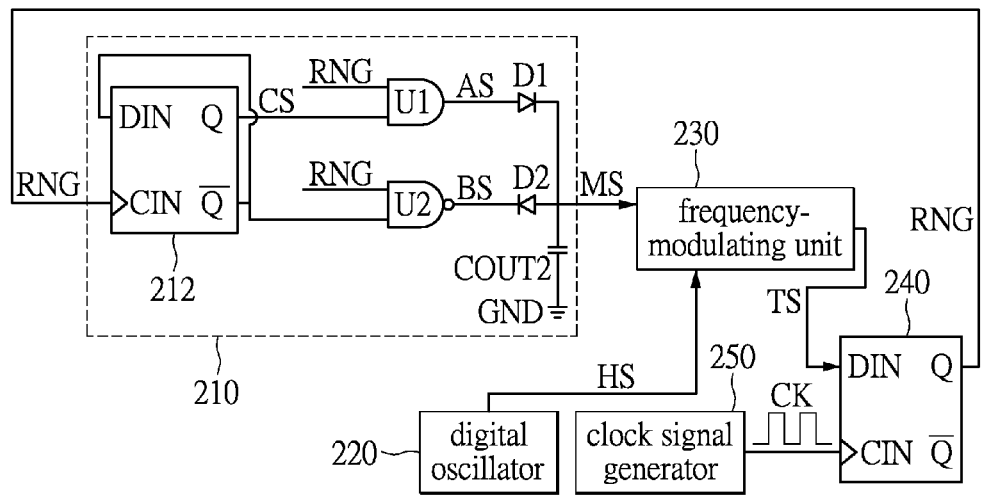
FIG. 6 shows a circuit schematic diagram of the self-feedback random generator according to another one embodiment of the instant disclosure.

Referring to FIG. 6, FIG. 6 shows a circuit schematic diagram of the self-feedback random generator according to another one embodiment of the instant disclosure. In the present embodiment, the digital-to-analog converter 210 of the self-feedback random generator 600 comprises a second D type flip-flop 212, an AND gate U1, an anti-AND gate U2, a first diode D1, a second diode D2 and a second output capacitor COUT2.

Clock input terminal of the second D type flip-flop 212 receives the digital random signal RNG, and data input terminal DIN of the second D type flip-flop 212 is connected to anti-phase data output terminal of the second D type flip-flop 212. The first input terminal of the AND gate U1 receives the digital random signal RNG, and second input terminal of the AND gate U1 is connected to data output terminal Q of the second D type flip-flop 212 for receiving the data signal CS. First input terminal of the anti-AND gate U2 receives the digital random signal RNG, and second input terminal of the anti-AND gate U2 is connected to data input terminal DIN of the second D type flip-flop 212. Anode of the first diode D1 is connected to output terminal of the AND gate U1, and cathode of the first diode D2 is connected to the frequency-modulating unit 230. Cathode of the second diode D2 is connected to output terminal of the anti-AND gate U2, and anode of the second diode D2 is connected to the frequency-modulating unit 230 and cathode of the first diode D1. One terminal of the second output capacitor COUT2 is connected to anode of the second diode D2, and another terminal of the second output capacitor COUT2 is connected to the ground voltage GND, wherein capacitor voltage of the second output capacitor COUT2 is served as voltage level of the analog random signal MS.

There is further instruction in teaching an operation mechanism of the self-feedback random generator 600.

In the digital-to-analog converter 210 of the instant disclosure, voltage level of the analog random signal MS may be adjusted (e.g. increase or decrease) by voltage level of the digital random signal RNG and the data signal CS. Furthermore, in the present embodiment, when voltage level of the digital random signal RNG is high voltage level and voltage level of the data signal CS is high voltage level, voltage level of the analog random signal MS may increase; when voltage level of the digital random signal RNG is high voltage level and voltage level of the data signal CS is low voltage level, voltage level of the analog random signal MS may decrease. Additionally, when voltage level of the digital random signal RNG is low voltage level, voltage level of the analog random signal MS is unchanged. In another embodiment, when voltage level of the digital random signal RNG is high voltage level and voltage level of the data signal CS is high voltage level, voltage level of the analog random signal MS may decrease; when voltage level of the digital random signal RNG is high voltage level and voltage level of the data signal CS is low voltage level, voltage level of the analog random signal MS may increase; and when voltage level of the digital random signal RNG is high voltage level, voltage level of the analog random signal MS is unchanged. Moreover, in one embodiment, when voltage level of the digital random signal RNG is low voltage level and voltage level of the data signal CS is high voltage level, voltage level of the analog random signal MS may increase. When voltage level of the digital random signal RNG is low voltage level and voltage level of the data signal CS is low voltage level, voltage level of the analog random signal MS may decrease; and when voltage level of the digital random signal RNG is high voltage level, voltage level of the analog random signal MS is unchanged.

Figure 7:
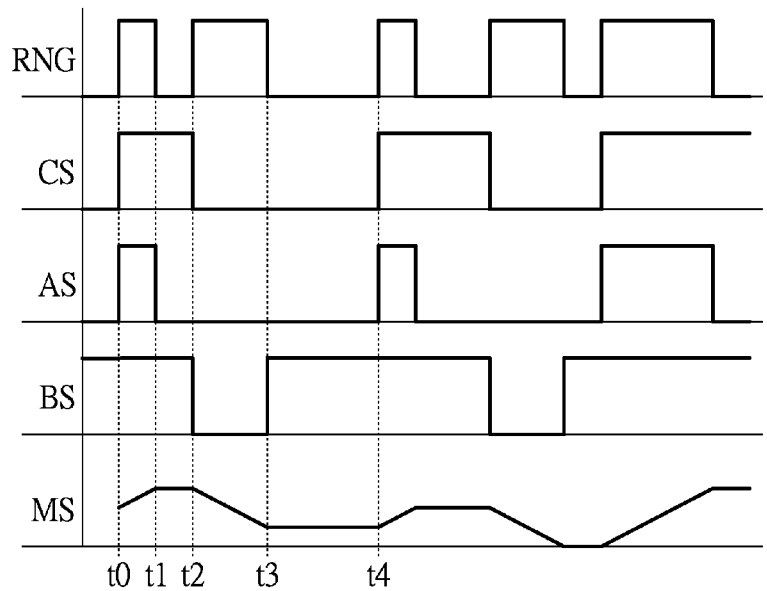
FIG. 7 shows driving waveform diagram of the self-feedback random generator corresponding to FIG. 6.

Furthermore, referring to FIGS. 6 and 7, FIG. 7 shows driving waveform diagram of the self-feedback random generator corresponding to FIG. 6. At time t0~t1, when the digital-to-analog converter 120 receives the digital random signal RNG with digital logic 「1」 and the AND gate U1 receives the data signal CS with digital logic 「1」, the AND gate U1 and the anti-AND gate U2 may respectively output first output signal AS with digital logic 「1」 and the second output signal BS with digital logic 「1」, such that the first diode D1 enters into switched-on state and the second diode D2 enters into switched-off state. Therefore, capacitor voltage of the second output capacitor COUT2 increase; which means, voltage value of the analog random signal MS may increase. Next, at time t1~t2, when the digital-to-analog converter 120 receives the digital random signal RNG with digital logic 「0」 and the AND gate U1 receives the data signal CS with digital logic 「1」, the AND gate U1 and the anti-AND gate U2 may respectively output first output signal AS with digital logic 「0」 and the second output signal BS with digital logic 「1」. Therefore, capacitor voltage of the second output capacitor COUT2 is unchanged; which means, voltage value of the analog random signal MS is unchanged. At time t2~t3, when the digital-to-analog converter 120 receives the digital random signal RNG with digital logic 「11」 and the AND gate U1 receives the data signal CS with digital logic 「00」, the AND gate U1 and the anti-AND gate U2 may respectively output first output signal AS with digital logic 「00」 and the second output signal BS with digital logic 「00」, such that the first diode D1 enters into switched-off state and the second diode D2 enters into switched-on state. Therefore, capacitor voltage of the second output capacitor COUT2 starts to discharge so that voltage value of the analog random signal MS starts to decrease, wherein discharging path is from the second diode D2, the anti-AND gate U2 to the ground terminal. At time t3~t4, when the digital-to-analog converter 120 receives the digital random signal RNG with digital logic 「000」 and the AND gate U1 receives the data signal CS with digital logic 「000」, the AND gate U1 and the anti-AND gate U2 may respectively output first output signal AS with digital logic 「000」 and the second output signal BS with digital logic 「111」, such that the first diode D1 and the second diode D2 enter into switched-off state. Therefore, capacitor voltage of the second output capacitor COUT2 is unchanged; which means, voltage value of the analog random signal MS is unchanged.

[One Embodiment of the Self-Feedback Random Generating Method]

Figure 8:
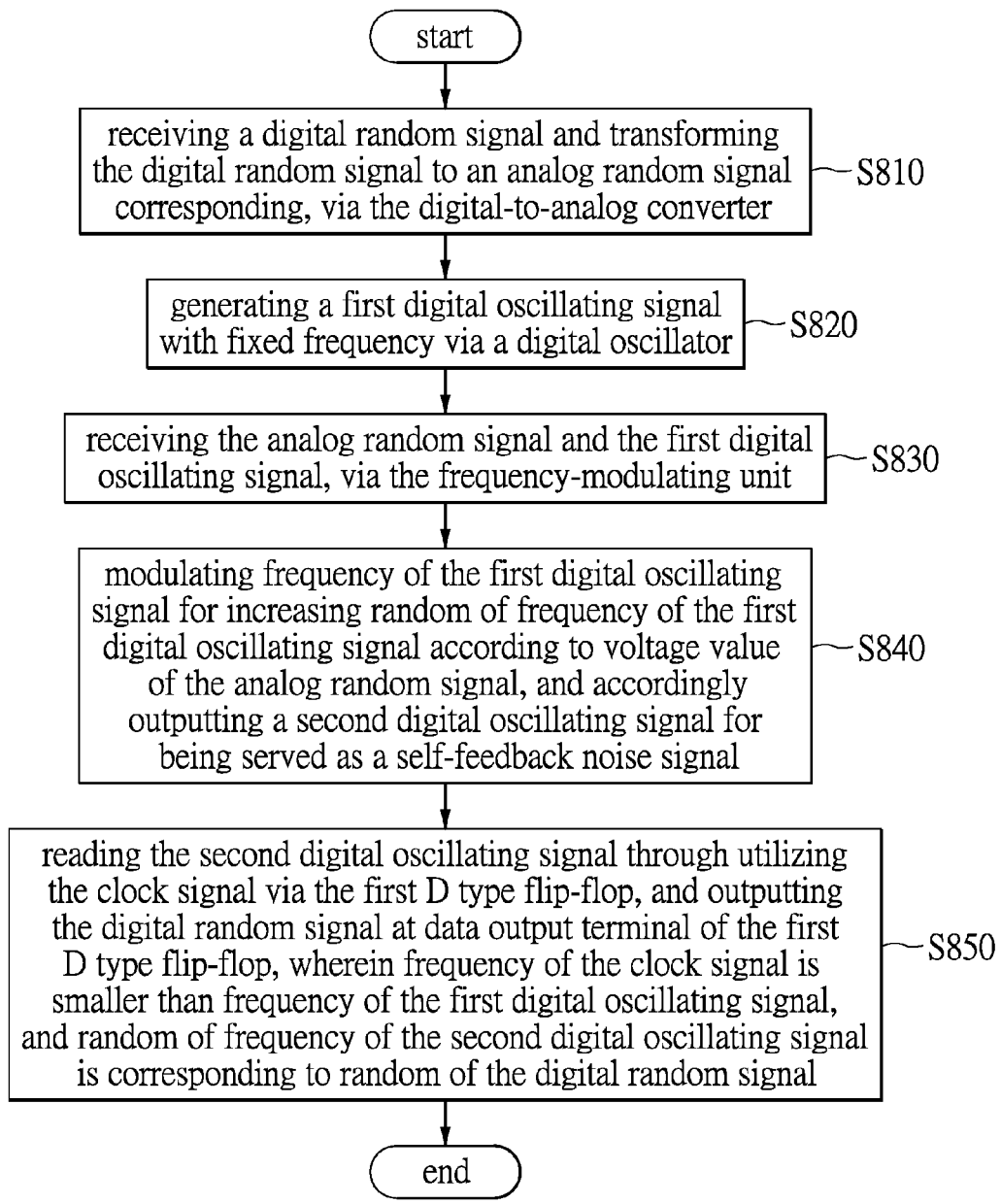
FIG. 8 shows flow chart of the self-feedback random generating method according to one embodiment of the instant disclosure.

Referring to FIG. 8, FIG. 8 shows flow chart of the self-feedback random generating method according to one embodiment of the instant disclosure. An explanatory sequence of steps in the present embodiment may be embodied with the self-feedback random generator 200, 400 or 600 as respectively shown in FIG. 2, 4 or 6, and thus please refer to FIGS. 2~7 for an easy understanding. The self-feedback random generating method comprises steps as follows: receiving a digital random signal and transforming the digital random signal to an analog random signal corresponding, via the digital-to-analog converter (step S810); generating a first digital oscillating signal with fixed frequency via a digital oscillator (step S820); receiving the analog random signal and the first digital oscillating signal, via the frequency-modulating unit (step S830); modulating frequency of the first digital oscillating signal for increasing random of frequency of the first digital oscillating signal according to voltage value of the analog random signal, and accordingly outputting a second digital oscillating signal for being served as a self-feedback noise signal (step S840); reading the second digital oscillating signal through utilizing the clock signal via the first D type flip-flop, and outputting the digital random signal at data output terminal of the first D type flip-flop, wherein frequency of the clock signal is smaller than frequency of the first digital oscillating signal, and random of frequency of the second digital oscillating signal is corresponding to random of the digital random signal (step S850).

Relevant details of the steps of the self-feedback random generating method of the self-feedback random generator regarding are described in the embodiments of FIGS. 2-7, and thus it is not repeated thereto. It is clarified that, a sequence of steps in FIG. 8 is set for a need to instruct easily, and thus the sequence of the steps is not used as a condition in demonstrating the embodiments of the instant disclosure.

To sum up, the self-feedback random generator and the self-feedback random generating method thereof provided by the instant disclosure make the digital random signal (i.e. random code) outputted from the first D type flip-flop feedback to the digital-to-analog converter so as to generate the analog random signal, and then modulate the first digital oscillating signal via the analog random signal for increasing or decrease frequency of the first digital oscillating signal and increasing randomness of random number. Accordingly, the self-feedback random generator is able to generate sequence of random code for increasing the convenience and popularity of electronic trading applications.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A self-feedback random generator, comprising:
   a digital-to-analog converter, receiving a digital random signal and transforming the digital random signal to an analog random signal correspondingly;
   a digital oscillator, used for generating a first digital oscillating signal with fixed frequency;
   a frequency-modulating unit, electrically connected to the analog random signal and the digital oscillator, the frequency-modulating unit modulating frequency of the first digital oscillating signal according to voltage value of the analog random signal for increasing random of frequency of the first digital oscillating signal, and accordingly outputting a second digital oscillating signal to be served as a self-feedback noise signal; and
   a first D type flip-flop, having data input terminal electrically connected to the frequency-modulating unit for receiving the second digital oscillating signal, having clock input terminal receiving a clock signal, and the first D type flip-flop reading the second digital oscillating signal through utilizing the clock signal and outputting the digital random signal at data output terminal,
   wherein frequency of the clock signal is smaller than frequency of the first digital oscillating signal, and the random of frequency of the second digital oscillating signal is corresponding to random of the digital random signal.

2. The self-feedback random generator according to claim 1, further comprising:
   a clock signal generator, electrically connected to clock input terminal of the first D type flip-flop, and the clock signal generator being used for the clock signal.

3. The self-feedback random generator according to claim 1, wherein the digital-to-analog converter comprises:
   a first current source, having one terminal connected to system voltage;
   a P type transistor, having source connected to another terminal of the first current source, having gate receiving digital random signal;
   an N type transistor, having drain connected to drain of the P type transistor and the frequency-modulating unit, having gate connected to gate of the P type transistor;
   a second current source, having one terminal connected to a source of the N type transistor; and
   a first output capacitor, having one terminal connected to the drain of the N type transistor, having another terminal connected to the ground voltage, wherein capacitor voltage of the first output capacitor is served as voltage level of the analog random signal,
   wherein under a situation that the first switch and second switch are in switched-on state, when voltage level of the digital random signal is low voltage level, the P type transistor and the N type transistor respectively enter into switched-on state and switched-off state such that the first current source outputs a charging current for charging the first output capacitor; when voltage level of the digital random signal is high voltage level, the P type transistor and the N type transistor respectively enter into switched-off state and switched-on state such that the first output capacitor outputs a discharging current to ground terminal of the ground voltage.

4. The self-feedback random generator according to claim 1, wherein the digital-to-analog converter comprises:
   a second D type flip-flop, having clock input terminal receiving the digital random signal, having data input terminal connected to anti-phase data output terminal of the second D type flip-flop;
   an AND gate, having first input terminal receiving the digital random signal, having second input terminal connected to the data output terminal of the second D type flip-flop for receiving a data signal;
   an anti-AND gate, having first input terminal receiving the digital random signal, having second input terminal connected to the data input terminal of the second D type flip-flop;
   a first diode, having anode connected to output terminal of the AND gate, having cathode connected to the frequency-modulating unit;
   a second diode, having cathode connected to output terminal of the anti-AND gate, having anode connected to the frequency-modulating unit and cathode of the first diode; and
   a second output capacitor, having one terminal connected to anode of the second diode, having another terminal connected to a ground voltage, wherein capacitor voltage of the second output capacitor is served as voltage level of the analog random signal,
   wherein voltage of the analog random signal is adjusted according to voltage level of the digital random signal and the data signal.

5. The self-feedback random generator according to claim 4, wherein when voltage level of the digital random signal and the data signal are high voltage level, voltage level of the analog random signal increases; when voltage level of the digital random signal is high voltage level and voltage level of the data signal is low voltage level, voltage level of the analog random signal decreases, wherein when voltage level of the digital random signal is low voltage level, voltage level of the analog random signal is unchanged.

6. A self-feedback random generating method, used for a self-feedback random generator, the self-feedback random generator comprising a digital-to-analog converter, a digital oscillator, a frequency-modulating unit and a first D type flip-flop, wherein the frequency-modulating unit is electrically connected to the digital-to-analog converter and the digital oscillator, data input terminal of the first D type flip-flop is electrically connected to the frequency-modulating unit, clock input terminal of the first D type flip-flop receives a clock signal, and the self-feedback random generating method comprises:
   receiving a digital random signal and transforming the digital random signal to an analog random signal corresponding, via the digital-to-analog converter;
   generating a first digital oscillating signal with fixed frequency;
   receiving the analog random signal and the first digital oscillating signal, via the frequency-modulating unit;
   modulating frequency of the first digital oscillating signal for increasing random of frequency of the first digital oscillating signal according to voltage value of the analog random signal, and accordingly outputting a second digital oscillating signal for being served as a self-feedback noise signal; and reading the second digital oscillating signal through utilizing the clock signal via the first D type flip-flop, and outputting the digital random signal at data output terminal of the first D type flip-flop, wherein frequency of the clock signal is smaller than frequency of the first digital oscillating signal, and random of frequency of the second digital oscillating signal is corresponding to random of the digital random signal.

7. The self-feedback random generating method according to claim 6, wherein the self-feedback random generator further comprises a clock signal generator, the clock signal generator is electrically connected to clock input terminal of the first D type flip-flop, and the clock signal generator is used for generating the clock signal.

8. The self-feedback random generating method according to claim 6, wherein the digital-to-analog converter comprises:
   a first switch, having first terminal connected to a system voltage, having control terminal receiving an enable signal so as to determine switched-on or switched-off state;
   a first current source, having one terminal connected to second terminal of the first switch;
   a P type transistor, having source connected to another terminal of the first current source, having gate receiving the digital random signal;
   a N type transistor, having drain connected to drain of the P type transistor, having gate connected to gate of the P type transistor;
   a second current source, having one terminal connected to source of the N type transistor;
   a second switch, having first terminal connected to another terminal of the second current source, having second terminal connected to a ground voltage, having control terminal receiving the enable signal so as to determine switched-on or switched-off state; and
   a first output capacitor, having one terminal connected to drain of the N type transistor, having another terminal connected to the ground voltage, wherein capacitor voltage of the first output capacitor is served as voltage level of the analog random signal,
   wherein under a situation that the first switch and the second switch are in switched-on state, when voltage level of the digital random signal is low voltage level, the P type transistor and the N type transistor respectively enter into switched-on and switched-off state such that the first current source outputs a charging current for charging the first output capacitor; when voltage level of the digital random signal is high voltage level, the P type transistor and the N type transistor respectively enter into switched-off or switched-on state such that the first output capacitor outputs a discharging current to ground terminal of the ground voltage for discharging.

9. The self-feedback random generating method according to claim 6, wherein the digital-to-analog converter comprises:
   a second D type flip-flop, having clock input terminal receiving the digital random signal, having data input terminal connected to anti-phase data output terminal of the second D type flip-flop;
   an AND gate, having first input terminal receiving the digital random signal, having second input terminal connected to data output terminal of the second D type flip-flop for receiving a data signal;
   an anti-AND gate, having first input terminal receiving the digital random signal, having second input terminal connected to data input terminal of the second D type flip-flop;
   a first diode, having anode connected to output terminal of the AND gate, having cathode connected to the frequency-modulating unit;
   a second diode, having cathode connected to output terminal of the anti-AND gate, having anode connected to the frequency-modulating unit and cathode of the first diode; and
   a second output capacitor, having one terminal connected to anode of the second diode, having another terminal connected to a ground voltage, wherein capacitor voltage of the second output capacitor is served as voltage level of the analog random signal,
   wherein voltage level of the digital random signal and the data signal are high voltage level, voltage level of the analog random signal increase; when voltage level of the digital random signal and the data signal are respectively high voltage level and low voltage level, voltage level of the analog random signal decrease.

10. The self-feedback random generating method according to claim 9, when voltage level of the digital random signal is low voltage level, voltage level of the analog random signal is unchanged.

\* \* \* \* \*